United States Patent
Chan et al.

[11] Patent Number: 6,047,637
[45] Date of Patent: Apr. 11, 2000

[54] METHOD OF PASTE PRINTING USING STENCIL AND MASKING LAYER

[75] Inventors: Albert W. Chan, Cupertino; Michael G. Lee, San Jose, both of Calif.

[73] Assignee: Fujitsu Limited, Japan

[21] Appl. No.: 09/335,389

[22] Filed: Jun. 17, 1999

[51] Int. Cl.[7] .................................................. B41M 1/12
[52] U.S. Cl. ................ 101/129; 101/128.21; 228/248.1; 228/254
[58] Field of Search ................................ 101/129, 128.4, 101/128.21, 127, 114; 228/248.1, 254

[56] References Cited

U.S. PATENT DOCUMENTS

| | | | |
|---|---|---|---|
| 3,458,925 | 8/1969 | Napier et al. | 29/578 |
| 3,644,180 | 2/1972 | Burock et al. | 204/15 |
| 4,172,907 | 10/1979 | Mones et al. | 427/96 |
| 4,678,531 | 7/1987 | Metzger et al. | 156/250 |
| 5,001,829 | 3/1991 | Schelhorn | 29/840 |
| 5,240,816 | 8/1993 | Noguchi et al. | 430/308 |
| 5,246,880 | 9/1993 | Reele | 437/183 |
| 5,368,883 | 11/1994 | Beaver | 427/96 |
| 5,423,939 | 6/1995 | Bryant | 216/18 |
| 5,460,316 | 10/1995 | Hefele | 228/39 |
| 5,492,266 | 2/1996 | Hoebener | 228/248.1 |
| 5,496,770 | 3/1996 | Park | 437/183 |
| 5,536,677 | 7/1996 | Hubacher | 437/183 |
| 5,547,530 | 8/1996 | Nakamura et al. | 156/89 |
| 5,587,337 | 12/1996 | Idaka et al. | 437/183 |
| 5,593,080 | 1/1997 | Teshima et al. | 228/39 |
| 5,620,131 | 4/1997 | Kane et al. | 228/215 |
| 5,641,113 | 6/1997 | Somaki et al. | 228/180.22 |
| 5,672,260 | 9/1997 | Carey et al. | 205/118 |
| 5,716,663 | 2/1998 | Capote et al. | 427/96 |
| 5,738,269 | 4/1998 | Materton | 228/248.1 |
| 5,740,730 | 4/1998 | Thopmson, Sr. | 101/127 |
| 5,743,007 | 4/1998 | Onishi et al. | 29/840 |
| 5,744,382 | 4/1998 | Kitayama et al. | 438/106 |
| 5,759,737 | 6/1998 | Feilchenfeld et al. | 430/311 |
| 5,762,259 | 6/1998 | Hubstrate | 228/180.22 |
| 5,937,320 | 8/1999 | Andricacos et al. | 438/614 |
| 5,946,546 | 8/1999 | Fillion et al. | 438/15 |

*Primary Examiner*—John S. Hilten
*Assistant Examiner*—Anthony H. Nguyen
*Attorney, Agent, or Firm*—Coudert Brothers

[57] ABSTRACT

A method for depositing a solder paste or other conductive or non-conductive material on a contact pad or other designated region of a substrate. A layer of resist is applied over the boundary of a region in which a bump of a deposited material is to be formed. The resist layer is applied by a screen printing process in which the portion of the screen overlying the region is blocked so that no resist is deposited where the bump is to be formed. The screen is open in the areas surrounding the blocked portion, permitting resist to be deposited over any non-planar surfaces surrounding the intended bump location. This provides a substantially planar surface which may be used as a mask for direct paste deposition into the region where the bump is to be formed, or the planar surface may be used as a flat surface upon which a stencil may be supported. After formation of the bump of conductive or non-conductive paste, the sacrificial resist layer is removed.

8 Claims, 1 Drawing Sheet

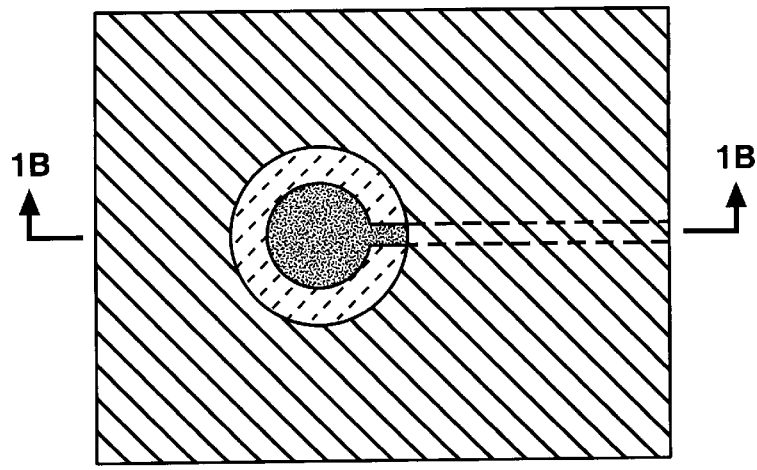
FIG._1A
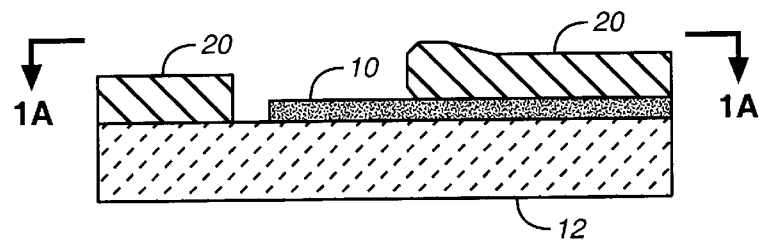
FIG._1B
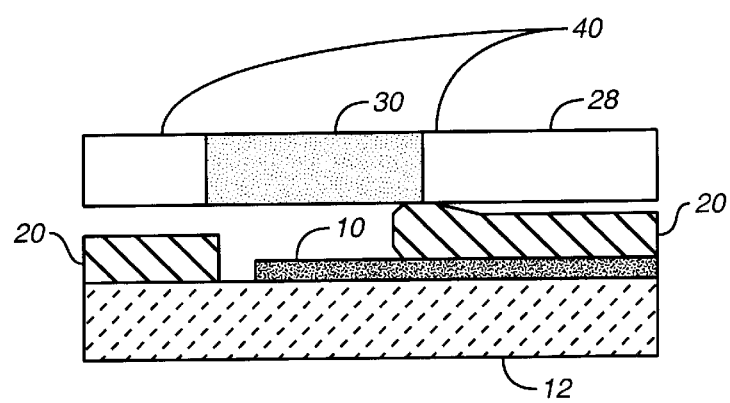
FIG._2
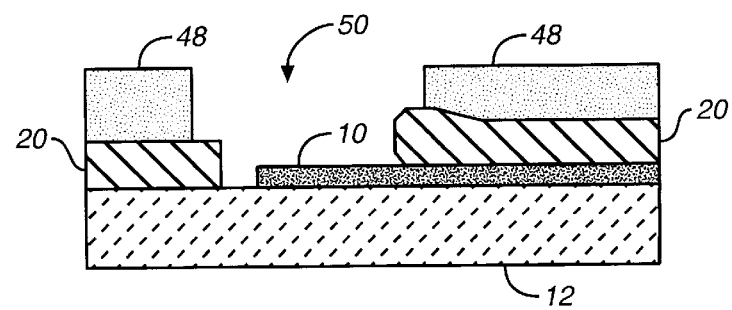
FIG._3

METHOD OF PASTE PRINTING USING STENCIL AND MASKING LAYER

BACKGROUND OF TH INVENTION

1. Field of the Invention

The present invention relates to methods for depositing conductive and non-conductive pastes onto the contact pads or other designated regions of a substrate, and more specifically, to a method of depositing such pastes using a stencil and a sacrificial resist layer to provide a planar surface for deposition of the paste through the stencil.

2. Description of the Prior Art

In the electronics industry, the trend toward smaller component sizes and higher integration densities of integrated circuits has necessitated the development of techniques for application of solder and other materials to extremely small areas and in carefully controlled volumes. For example, printed circuit boards designed for use with surface-mounted components are often provided with a plurality of contact pads on their surface. The surface-mounted components are conventionally mounted by using connector leads on the individual component's body. In order to mechanically and electrically connect the connector leads of a component to the contact pads of the printed circuit board, the contact pads are typically provided with a layer of solder paste (solder powder in a viscous binder) prior to placement of the connector leads thereon. Once the component has been positioned on the appropriate contact pads, the solder paste is melted and subsequently solidifies to form a mechanical and electrical connection between the connector leads of the component and the contact pads.

A stencil or other type of mask is conventionally used to apply the solder paste onto the contact pads. Stencils typically have a plurality of apertures which are positioned in the stencil in a predetermined pattern and correspond with the pattern of contact pads on a particular printed circuit board. A stencil is positioned over the surface of the printed circuit board in the region having the contact pads upon which solder paste is to be applied. The apertures in the stencil are then aligned over the contact pads. Solder paste is urged mechanically by, for example, a squeegee, across the upper surface of the stencil and through the apertures in the stencil. A region of solder paste is thereby accurately deposited on the appropriate contact pads. This method of paste deposition is sometimes referred to as "stencil printing".

However, a problem encountered when using such paste printing techniques is that irregularities in the distribution of the solder paste can be caused by the separation of the stencil mask from the surface on which the stencil rests during application of the paste. If the stencil does not rest on a substantially planar surface, or if the mask used to define the region where the paste is to be deposited is not substantially planar, then the paste may not be deposited uniformly or be confined to the appropriate region.

What is desired is a method for depositing a solder paste or other conductive or non-conductive paste onto a region of a substrate which produces a properly formed paste deposit in the situation where the region is bounded by non-planar surfaces.

SUMMARY OF THE INVENTION

The present invention is directed to a method for depositing a solder paste or other conductive or non-conductive material on a contact pad or other designated region of a substrate. The inventive method produces a more uniform bump of the deposited material than conventional techniques and prevents accumulation of the material in non-planar regions of the designated region or its surrounding boundaries.

In practicing the invention, a layer of resist is applied over the boundary of a region in which a bump of a deposited material is to be formed. The resist layer is applied by a screen printing process in which the portion of the screen overlying the region is blocked so that no resist is deposited where the bump is to be formed. The screen is open in the areas surrounding the blocked portion, permitting resist to be deposited over any non-planar surfaces surrounding the intended bump location. This provides a substantially planar surface which may be used as a mask for direct paste deposition into the region where the bump is to be formed, or the planar surface may be used as a flat surface upon which a stencil may be supported. After formation of the bump of conductive or non-conductive paste, the sacrificial resist layer is removed.

If a solder mask is present, the resist layer fills up the non-planar regions in the solder mask layer surrounding the pads, which assists in preventing undesirable accumulation of the later deposited paste in depressions present on the solder mask layer. The resist layer can also function as a spacer, providing increased volume for paste deposition during stencil printing, and in the case of solder printing, for the solder to reshape during reflow. The presence of the resist layer also facilitates the process of releasing the stencil from its position. The inventive method preserves the nature of the pad surface since the resist is not in direct contact with the pads. This ensures good bonding between the pad and bump material without additional-treatment steps. Since the patterning of the resist is accomplished by a printing process, the resist is not limited to photosensitive materials or compounds, as in the case of using photoresist dry film or a liquid coating approach. The selection of resist material is therefore open to a wider range in terms of process temperature and other processing variables.

BRIEF DESCRIPTION OF THE DRAWINGS

FIG. 1 shows a top (FIG. 1(A)) and side (FIG. 1(B)) view of the regions bounding a conductive pad or other surface onto which it is desired to deposit a paste material, illustrating the non-planarity of the surrounding regions.

FIG. 2 is a cross-sectional side view showing how a resist layer is applied to an underlying solder mask or other surface to provide a more planar surface, in accordance with the method of the present invention.

FIG. 3 is a cross-sectional view showing the result of applying a resist layer to the structure of FIG. 1(B), in accordance with the method of the present invention.

DETAILED DESCRIPTION OF THE INVENTION

The present invention is directed to a method of depositing a conductive or non-conductive material (such as a solder paste or adhesive) onto the contact pads of a substrate. The method may also be used to deposit the material onto other masked regions of a substrate. The paste deposition or printing process is improved by deposition of a sacrificial resist layer over the solder mask (or other type of region defining element) used to define the region in which the material is to be deposited. The resist layer provides a substantially planar surface over the irregular solder mask, or substrate surface surrounding the contact pad location, if a solder mask is not used. The resist layer serves as a stencil for paste printing of the conductive or non-conductive material, or as a planar support surface for a stencil. The resulting bump(s) of printed material are more uniform, stronger, and of a more consistent size and shape than can be obtained without use of the inventive resist layer.

FIG. 1 shows a top (FIG. 1(A)) and side (FIG. 1(B)) view of the regions bounding a conductive pad or other surface on which it is desired to deposit a paste material, illustrating the non-planarity of the surrounding regions. In the figure, the conductive pad is identified as an "electrically conductive layer" 10 formed on substrate 12. A region in which it is desired to deposit a solder paste or other conductive or non-conductive material is defined by a mask 20 (labeled "solder mask" in the figure). Solder mask 20 is conventionally used to prevent solder paste from covering circuit traces upon reflow of the solder. As shown in the figure, depending upon the process used to form mask 20, the mask material used, or the topology of surface of layer 10, mask 20 may form a non-planar surface. The non-planar regions of the solder mask layer can provide regions for the paste to flow into and accumulate if printing or stenciling is performed directly on the solder mask. It is noted that layers produced by liquid-coating or dry-film lamination can also produce such non-planar regions.

Because such non-planar regions provide areas in which a deposited paste can accumulate, the solder (or other material) bump formed may not be of uniform strength or size compared to other bumps. This can lead to failure of a connector lead to contact pad connection, and undesired variations in the electrical properties of the connections. Note that although FIG. 1 depicts the situation in which a solder mask is formed on the surface of an electrically conducting layer, the present invention is also applicable to situations in which no solder mask is used (in which case the sacrificial resist layer is applied to the areas surrounding the contact pad) and to situations in which a bump of a non-conductive paste material (e.g., an adhesive) is to be formed directly on substrate 12.

The problems caused by the non-planar surface of the solder mask shown in FIG. 1 are overcome, in accordance with the present invention, by formation of a resist layer on top of the mask. The resist serves as a planarization layer for the structure and assists in proper deposition of the solder paste or other material. FIG. 2 is a cross-sectional side view showing how a resist layer is applied to an underlying solder mask or other surface to provide a more planar surface, in accordance with the method of the present invention. The resist layer (not shown) is applied by a screen printing process, using screen 28. Screen 28 serves to mask the desired region for formation of the paste bump, thereby preventing the resist from being deposited in that region. Thus, the portions of the screen overlying the intended region of the paste bump 30 are blocked, while those regions of the screen bounding the paste bump region 40 are left open to permit deposition of the resist and formation of a planarization layer.

FIG. 3 is a cross-sectional view showing the result of applying a resist layer 48 to the structure of FIG. 1(B), in accordance with the method of the present invention. As shown in the figure, after printing of the resist through screen 28, the screen is removed. This leaves resist layer 48 formed on top of solder mask 20 in the regions bounding the area 50 in which the bump is to be formed. Resist layer 48 is substantially planar and provides a mask for deposition of the paste material by a printing process. Resist layer 48 also provides a flat surface on which a stencil may be placed for use in a stencil printing process. After formation of the bump on the contact pad or other substrate region, resist layer 48 is removed.

An alternate embodiment of the inventive process is to screen print the resist layer onto the contact pad periphery or substrate, print the paste material to form a bump in the region defined by the resist layer (and process the paste material if necessary), strip off the resist, and then form the solder mask to control solder movement in subsequent soldering operations. In this case, the bump is formed prior to deposition of the solder mask.

The formation of the resist layer by printing can be used to fill in the nonplanar regions in the solder mask surrounding the contact pads or other type of mask used to define a region on a material layer or substrate. This helps prevent undesirable accumulation of paste in depressions found in the mask layer. The resist layer can also function as a spacer, providing more volume for paste deposition during stencil printing, and in the case of solder printing, for the solder to reshape during reflow. The presence of the resist layer also facilitates releasing the stencil from the structure.

If photo imaging of liquid-coated or laminated dry film photoresist is used to define a bump region, then the contact pads may come in contact with the photoresist and developer before paste is printed on. This can alter the adhesion and electrical characteristics of the pad surface. In contrast, the method of the present invention preserves the nature of the pad surface since the resist is not in direct contact with the pad. This ensures good bonding between the pad and bump material without the use of additional treatment steps for the contact pad.

Since the patterning of the resist is by means of a printing process, the resist material which forms the sacrificial planarization layer is not limited to photosensitive materials or compounds, as in the case of using photoresist dry film or a liquid coating. This also means that photolithography process steps are not required to define the bump location when practicing the present invention. The selection of resist material is therefore open to a wide range in terms of process temperature and other processing variables. In general, the inventive method should reduce processing costs and cycle time compared to conventional methods, in addition to providing improvements in the quality of the solder (or other material) bumps. The inventive process can be extended to different structures requiring paste printing, as well as various bump materials, and shapes and sizes of the bumps.

A suitable resist material to use in forming the sacrificial layer is ETV248 acid etch, alkali strip UV etch-resist (manufactured by Electra, 2914 E. Katella Ave., Suite 208, Orange, Calif. 92667). Note that the screen mesh size can be used to control the thickness of the deposited resist. For example, a mesh size of 170 has a nominal wire diameter of 64 microns. This would give an as-deposited resist of roughly 50 microns thickness. After screen printing, the resist undergoes a soft bake process at about 90° C. to remove solvent. After the soft bake, the resist thickness would have shrunk to approximately 25 microns. It is then sufficiently solid to be used for the solder printing. The stripping solution used to remove the sacrificial resist layer for resist depends on its formulation. For the ETV248 resist, an alkali solution is used.

There are a number of solder masks commercially available which may be used in practicing the present invention. Electra, for example, manufactures the EMV30 UV solder mask. Another solder mask manufacturer is the Taiyo Company. A typical process flow for a solder mask is screen printing, soft bake to remove solvent, lithography and development (to create apertures in the solder mask), followed by a final bake to cure the solder mask. Once cured, the solder mask is relatively strong and is not easily removed by common solvents such as alcohol. A typical solder mask material is based on epoxy resin, which when cured, has very good resistance to most solvents.

Note that a typical alkali stripping resist solvent or common solvent like isopropanol is not likely to damage the solder mask layer. The solder mask layer may slightly swell if left in a solvent for a long time. When subsequently dried, the swell can be removed. This behavior is due to the high cross-link density present in most epoxy resin materials after they are cured.

The planarity of a screen printed layer is typically very good since the coated resist can self-level after printing. Spin coating of resist is possible if the viscosity of the liquid resist is sufficiently low. This is typical for a positive-type resist used in higher resolution applications.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A method of forming a solder bump on a pad which is disposed on a surface of a substrate, comprising the steps of:
   (a) forming a solder mask over the surface of the substrate, the solder mask having an aperture which surrounds the pad;
   (b) forming a planarization layer over the solder mask such that the planarization layer has an aperture which surrounds the pad; and
   (c) after forming the planarization layer, depositing solder paste onto the pad by screening or stenciling.

2. The method of claim 1, wherein step (b) comprises the step of screening a resist material onto the substrate surface.

3. The method of claim 1, further comprising the steps of:
   (d) heating the deposited solder paste to reflow the paste and form a solder bump; and
   (e) removing the planarization layer after the solder bump has been formed.

4. The method of claim 1, wherein the planarization layer comprises a photosensitive or non-photosensitive polymeric material.

5. A method of forming a solder bump on a pad which is disposed on a surface of a substrate, comprising the steps of:
   (a) forming a solder mask over the surface of the substrate, the solder mask having an aperture which surrounds the pad;
   (b) forming a planarization layer over the solder mask by a screening process, the planarization layer having an aperture which surrounds the pad; and
   (c) after forming the planarization layer, depositing solder paste onto the pad with a screening blade or stencil blade, with the blade directly contacting the planarization layer.

6. The method of claim 5, wherein the planarization layer comprises a photosensitive or non-photosensitive polymeric material.

7. A method of forming a solder bump on a pad which is disposed on a surface of a substrate, said substrate having a trace disposed on its surface and connected to the pad, comprising the steps of:
   (a) forming a planarization layer that has an aperture over the substrate surface and the trace by screen printing;
   (b) after forming the planarization layer, depositing solder paste onto the pad by screening or stenciling; and
   (c) removing the planarization layer after the solder paste has been deposited.

8. The method of claim 7, further comprising the step of heating the deposited solder paste to cause the paste to reflow and form a solder bump.

* * * * *